Aug. 26, 1952 R. A. EMMETT, JR 2,608,651

AUTOMATIC GAIN CONTROL SYSTEM

Filed Dec. 18, 1945

Inventor

ROBERT A. EMMETT JR.

By M. O. Hayes

Attorney

Patented Aug. 26, 1952 2,608,651

UNITED STATES PATENT OFFICE 2,608,651

AUTOMATIC GAIN CONTROL SYSTEM

Robert A. Emmett, Jr., United States Navy

Application December 18, 1945, Serial No. 635,823

5 Claims. (Cl. 250—20)

(Granted under the act of March 3, 1883, as amended April 30, 1928; 370 O. G. 757)

This invention relates in general to automatic gain control means and, more particularly, to means associated with a radio receiver for controlling the gain of the receiver as a function of the amplitude of signal pulses of a repetitive nature received therein.

In repetitive pulse radio transmitting and receiving systems, the problem of providing automatic volume control of the receiver dependent only upon the amplitude of the received pulse signal is rendered complex due to the short duration of the signal pulses as compared with the time duration of one cycle of operation, thus providing a low average voltage level variation for wide variations in peak pulse amplitude, and because of the presence of many spurious pulses such as interference signals and random noise picked up by the receiver which distorts the average voltage determined from the amplitude of the signal pulse and thus yields an average value proportional to the combined amplitude of all the signals occurring during one repetitive cycle.

Accordingly, it is an object of this invention to provide automatic gain control means for a radio receiving system for pulse signals in which the gain of the receiver is accurately controlled as a function of the signal pulse amplitude only.

Another object of the invention is to provide automatic gain control means for a radio receiving system for repetitive pulse signals in which the means is rendered sensitive to the amplitude of received signals substantially at the time of occurrence of the pulse signals only.

Another object of the invention is to provide automatic gain control means for a radio receiving system for repetitive pulse signals with which automatic tracking means is associated to maintain the gain control means sensitive to amplitude variations of the signal pulses only, regardless of variations in the time of occurrence of the signal pulses.

Other objects, advantages and capabilities, of the invention will become apparent with the following description, taken in conjunction with the accompanying drawing, showing only a preferred embodiment of the invention, in which.

Figure 1:
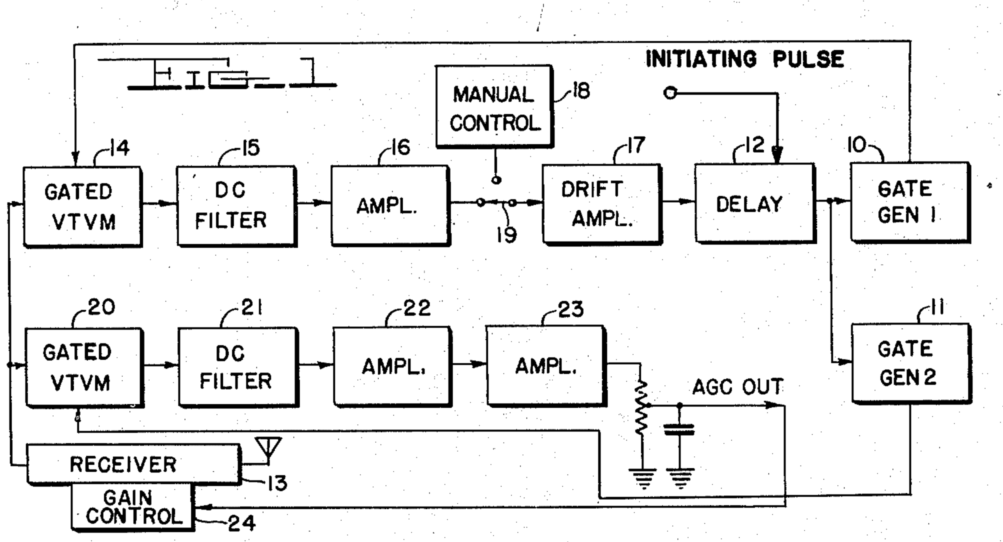
Fig. 1 is a block diagram of one embodiment of the instant automatic gain control system.

Referring now to Fig. 1, in which is shown the block diagram of the automatic gain control system, two gates are generated, hereafter referred to as gate 1 and gate 2. Gate 1 is a comparatively narrow gating pulse of about 3 microseconds duration. Gate 2 is about 10 microseconds in duration. These gates are generated in gate generator 10 and gate generator 11, respectively, the gate generators being triggered simultaneously by a delay circuit 12. This delay circuit 12 is a phantastron circuit (for circuit details see the circuit of which tube 102 is an element in Figure 2) which, when triggered by a cycle initiating or reference pulse recurring at the pre-established cycle repetition frequency of the pulse transmission system associated with the receiver 13 with which the automatic gain control system is adapted to operate, generates a pulse of variable width, this width being controlled by a direct current voltage. The trailing edge of this pulse is used to trigger the gate generators 10 and 11.

To obtain a control voltage for this delay generator 12, the video output of the receiver 13 is passed to the plate of a gated vacuum tube voltmeter circuit 14, this circuit being gated with the output pulse of the gate generator 10. This voltmeter circuit is similar to a normal shunt diode circuit except that a triode is used so that the tube may be turned on and off by the gate. The advantage of using this type of circuit is that no voltage output is developed unless the signal and the gate fed thereto coincide. The output of this tube is filtered through a direct current filter 15, passed through an amplifier 16, and then to a second amplifier 17 known as the drift amplifier. The drift amplifier 17 is so arranged that in the absence of the voltage output from the voltmeter circuit 14 generated when the signal and gate coincide, its plate drifts in a positive direction. With such a voltage, the delay circuit 12 will generate a pulse of increasing width, thereby timing the gate of gate generators 10 and 11 to occur with increasing delay with respect to the time of occurrence of the reference pulse. When the gate does run into a signal, the voltmeter circuit 14 will generate a voltage which drives the plate of the drift amplifier 17 in a negative direction thus causing a decreasing delay between the reference pulse and the gates. The net effect is such that the gate will balance on the leading edge of the signal. The three microsecond gate is used for this purpose so that the ten microsecond gate will then surround the signal in time.

Since this automatic gain control system is adapted to be used in a repetitive pulse transmitting and receiving system in which the signal pulses will occur at a variable time after the occurrence of the reference pulse, means must be provided for setting the automatic tracking unit at the approximate time of occurrence of the signal pulses when the unit is set into operation. Because the rate of drift of the drift amplifier 17 is comparatively slow, a manual control 18 is provided to set the initial position of the gate. In practice, the operator throws the drift amplifier 17 on manual control by means of switch 19, places the gate generated by gate generator 10 just short in delay time of the signal desired, and then throws the automatic following circuit on automatic operation. The gate will then drift the remaining distance into the signal, lock on the signal pulse, and follow the signal pulse from that point.

The circuit channel used to generate the automatic gain control voltage to be fed back to the receiver 13 is similar to the initial stages of the automatic tracking channel. This automatic gain control voltage is designed to vary with the peak amplitude of the pulse signal and to exclude spurious pulses and random noises which exist in the receiving unit. Accordingly, the video signal output of the receiver 13 is fed to another gated voltmeter circuit 20, which is gated by the 10 microsecond gate generator 11 whose output surrounds the signal pulse in time. The output of the voltmeter 20 is fed through a direct current filter 21 which averages over the period of one cycle of operation the amplitude of the 10 microsecond gate and any signal pulses or random noise pulses which may occur at the interval of recurrence of the 10 microsecond gate and in time coincidence therewith. This average D.-C. voltage is then coupled through a D.-C. amplifier 22 where the variations of the D.-C. voltage level in its output are amplified with respect to the variation of the output of the gated voltmeter 20. This varying D.-C. voltage is then coupled to a second amplifier 23 having short time constant output and input circuits so that the amplifier 23 acts as a quick-acting amplifier rather than a drift amplifier and as a consequence produces relatively fast automatic gain control action. The output of this amplifier 23 is fed through a conventional bleeder and direct current filter arrangement to the gain control unit 24 of the receiver 13 with which the system is associated to control the gain of signals in the receiver.

Figure 2:
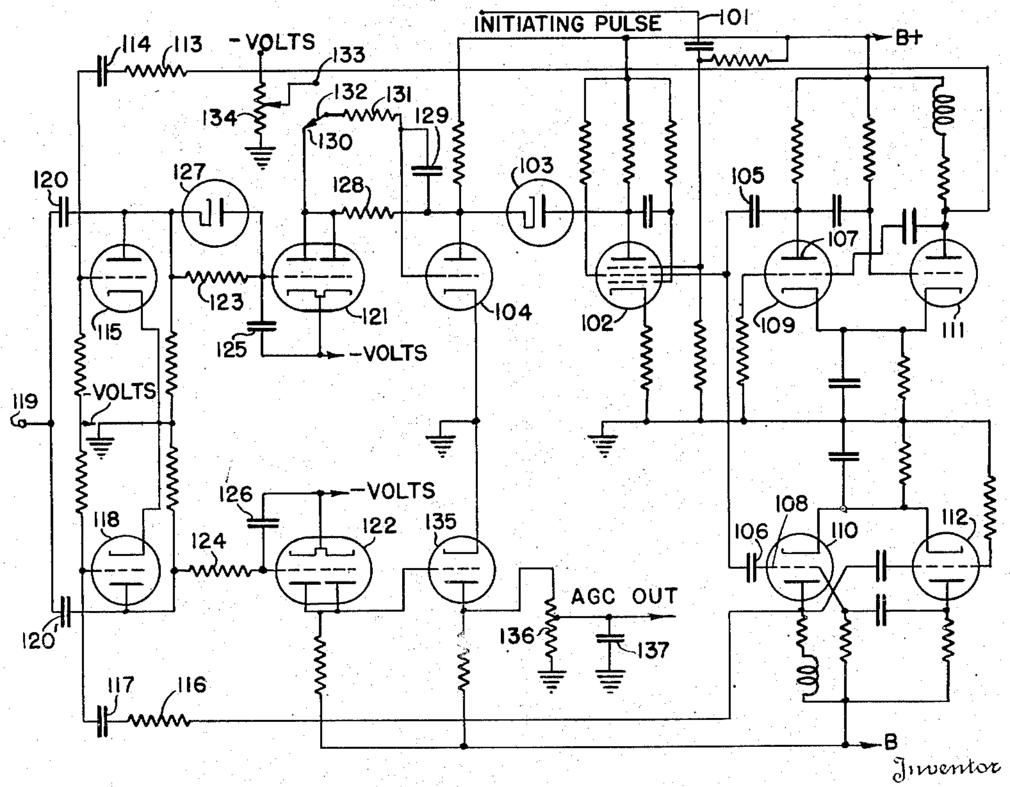
Fig. 2 is a schematic diagram of the automatic gain control, automatic tracking, and gate generating circuits making up the automatic gain control system.

Referring now to Fig. 2, showing the schematic diagram of the circuit constituting the automatic gain control system, the three microsecond gating pulse is maintained in coincidence with the pulse signal in the receiver 13 by the introduction of a variable delay into the automatic tracking channel, controlled as a function of the time occurrence of the signal pulse with respect to the occurrence of the cycle initiating reference pulse by means of a phantastron circuit as follows. An initiating pulse, obtained from any conventional external source and controlling the recurrent frequency of the cycles of operation of the transmitting and receiving system with which the automatic gain control system is operating, is carried through a connecting lead 101 to the suppressor grid of tube 102, which is a special pentode designed for phantastron operation. This initiating pulse triggers the phantastron 102 driving its plate suddenly to a less positive voltage. From this initial position the plate drifts gradually to a voltage less positive than said latter voltage as is characteristic of the phantastron circuit, fairly linearly, according to the constants of the parameters in the plate and grid circuits from a level which is determined by the voltage on the plate of diode 103 to a lower level determined by the tube constants, the plate of diode 103 being coupled directly to the plate of phantastron 102. This voltage in turn is determined by the plate voltage on the plate of triode amplifier tube 104 to which the cathode of the diode 103 is connected. A somewhat steeper-sided pulse is obtained on the screen grid of the phantastron tube 102.

This pulse is differentiated by condensers 105 and 106 coupled directly to the screen grid of the phantastron tube 102, so that the trailing edge of the phantastron output pulse triggers the tube in the multivibrator gate generators 10 and 11, Fig. 1, the pulses being coupled to the tubes through the plate 107 and the grid 108 of tubes 109 and 110, respectively. These multivibrators, comprising tubes 109, 111 and 110, 112, are interconnected as conventional plate-grid coupled, blocked multivibrators so arranged as to give output pulses at the plates of tubes 111 and 110 of three and ten microseconds, respectively. The pulses occurring at the plates of tubes 111 and 110 are then coupled to the automatic following and the automatic gain control voltmeter circuits to perform the time gating operation. The three microsecond gate, taken from the plate of tube 111 in the first mentioned gate generator is fed through resistor 113 and condenser 114 to the grid of triode 115 which forms the vacuum tube voltmeter for the automatic following channel. The ten microsecond gate is coupled from the plate of tube 110 through resistor 116 and capacitor 117 to the grid of triode 118 forming the gated voltmeter for the automatic gain control channel. Video output of the pulse receiver 13 is coupled from the terminal 119, the video input terminal to the automatic gain control unit, through condensers 120 and 120′ to the plates of the gated voltmeter tubes 115 and 118, respectively. The plates of the vacuum tube voltmeters 115 and 118 are coupled to the input grids of amplifier triodes 121 and 122 through direct current filter combinations formed of resistors 123 and 124 and condensers 125 and 126. The diode 127 placed across resistor 123 serves merely as an oscillation-suppressing diode. The plate of amplifier triode 121 is coupled through resistor 128 to the plate of the drift amplifier tube 104. In operation, when the pulse signal and the gate do not coincide in triode 115, the plate of tube 115 is approximately at ground level. Therefore, the amplifier 121 is conducting heavily, placing the plate of the amplifier 121 at low voltage tending to cut off drift amplifier 104. However, due to the feed back action of condenser 129, coupled between the plate and the grid of this amplifier 104, the plate of drift amplifier 104 drifts positive quite slowly.

The voltage level of the plate of drift amplifier 104 sets the width, through the diode 103, of the phantastron pulse generated by the phantastron 102. When the three microsecond gate and the signal coincide in tube 115, the plate of tube 115 is driven negative due to the charge taken up by the condenser 120. This negative going action is passed rapidly to the grid of tube 121 through diode 127, filtered by the action of condenser 125 and resistor 123. This brings the tube 121 into a condition approaching cut off, driving the plate of tube 121 positive, and resulting in conduction of tube 104 thus bringing its plate negative and narrowing the pulse output of the phantastron tube 102. However, in so doing, the gate is taken away from the signal, allowing the plate of the vacuum tube voltmeter 115 to drift toward ground again, so that the action is reversed. The net result is the three microsecond gate will rest on the leading edge of the pulse signal. The diode 127 is used to give an asymmetrical time constant, thereby minimizing the tendency of the gate to oscillate. The manual gate control is inserted at the input grid of the tube 104. The automatic control voltage on the plate of the amplifier 121 is passed through a connector to terminal 130 of a manual-automatic control switch 19. The grid of tube 104 is connected through a resistor 131 to the movable arm 132 of the control switch 19. The terminal 133, which together with terminal 130 is adapted to be selectively engaged by the movable arm 132 of the switch, is connected to the movable arm of the potentiometer 134 connected across a predetermined negative voltage and from which a variable D.-C. voltage can be picked off. Thus the grid of the tube 104 may be connected to either the automatic control voltage from the plate of tube 121 or the manual control voltage from the potentiometer 134. By adjustment of the cut off voltages of tubes 115 and 118 and tubes 121 and 122, through regulation of the D.-C. voltage level on the grids of the tubes 115 and 118 and on the cathodes of the tubes 121 and 122, the threshold values of pulse amplitude necessary to operate the circuit may be determined. That is, the circuits may be so adjusted as not to operate on a pulse smaller than some predetermined amplitude, thereby preventing the automatic following circuit from tracking noise and low voltage signals. Since the signal pulses picked up in the receiver 13 will recur each cycle of operation at substantially the same time with respect to the time of occurrence of an initiating pulse, or will only vary smoothly and in small increments therefrom, while noise signals will occur in a random abruptly varying time relation with the initiating pulse, the automatic following circuit will tend to lock on the recurring signal pulse, even when the amplitude of the random noise is greater.

The automatic gain control generator channel is quite similar to the automatic follower channel just described. The automatic gain control channel is composed of the vacuum tube voltmeter stage 118, a D.-C. amplifier 122, and a quick acting D.-C. amplifier 135, the grid of which is directly connected to the plate of the D.-C. amplifier 122. The ten microsecond gate of the gate generator composed of tubes 110 and 112 is used to gate the vacuum tube voltmeter 118 for the reason that the ten microsecond gate surrounds the pulse signal in time. When the signal and the gate coincide, a D.-C. voltage is developed at the plate of the voltmeter tube 118 which will be proportional to the amplitude of the input signal pulse. This voltage is filtered by the resistor 124 and condenser 126 and passed through the amplifier 122 to the quick acting amplifier 135 where a rapid response D.-C. voltage is generated which is proportional to the absolute amplitude of any signals occurring during the interal of the ten microsecond gate, thus the interval of conduction of voltmeter tube 118. This automatic gain control voltage is taken off at the plate of quick acting amplifier 135 and is fed through the potentiometer 136 and a conventional smoothing filter comprising condenser 137 having the proper value of capacitance to shunt to ground the ripple frequency variations present in the D.-C. control voltage fed to the gain control unit 24 of the receiver 13 to control the gain of this unit. In accordance with conventional practice, this automatic gain control voltage will be coupled as a varying D.-C. voltage to the grid of one or several of the stages in the intermediate frequency strip of the receiver 13 to control the gain of these stages and therefore the amplitude of the video output of the receiver as a function of the absolute pulse amplitude fed thereto from the antenna.

Various modifications may be made in the invention without departing from the spirit or scope thereof and it is desired, therefore, that only such limitations shall be placed thereon as are imposed by the prior art and are set forth in the appended claims.

The invention described herein may be manufactured and used by or for the Government of the United States of America for governmental purposes without the payment of any royalties thereon or therefor.

What is claimed is:

1. An automatic gain control voltage generating system for a pulse transmitting-receiving system comprising a source of reference pulses having substantially the same pulse repetition rate as the pulses transmitted by said pulse transmitting system, variable duration control pulse generating means having an input trigger terminal and a duration control terminal incorporated therein, said input trigger terminal being coupled to said reference pulse source and responsive to a pulse therefrom to generate a control pulse, a first gating pulse generating means coupled to said control pulse means and responsive to a pulse therefrom to generate a gating pulse of predetermined duration isochronal with the trailing edge of said control pulse, a coincidence circuit coupled to said first gating pulse means and to the pulse receiver of said pulse transmitting-receiving system, voltage generating means fed by the output of said coincidence circuit and coupled to said duration control terminal of said variable duration control pulse generating means for generating a voltage the magnitude of which varies in a first given direction upon non-coincidence of said gating pulse and received pulse and varies in the opposite direction upon coincidence of said gating pulse and received pulse, a second gating pulse generating means connected to said variable duration control pulse means and responsive to a pulse therefrom to generate a gating pulse of sufficient duration to overlap said received pulse upon coincidence occurring in said coincidence circuit, means coupled to said pulse receiver and said second gating pulse means responsive to a gating pulse to permit the passage therethrough of a coincident received pulse, and averaging means coupled to said last named means for deriving a direct current voltage proportional to the amplitude of said received pulse.

2. An automatic signal pulse tracking system for use in a pulse transmitting-receiving system comprising a source of reference pulses having substantially the same pulse repetition rate as the pulses transmitted by said pulse generating system, variable duration control pulse generating means having an input trigger terminal and a duration control terminal incorporated therein, said input trigger terminal being coupled to said reference pulse source and responsive to a pulse therefrom to generate a control pulse, gating pulse generating means coupled to said control pulse means and responsive to a pulse therefrom to generate a gating pulse of predetermined duration isochronal with the trailing edge of said control pulse, a coincidence circuit coupled to said gating pulse means and to the pulse receiver of said pulse transmitting-receiving system, voltage generating means fed by the output of said coincidence circuit and coupled to said duration control terminal of said variable duration control pulse generating means for generating a voltage the magnitude of which varies in a first given direction upon non-coincidence of said gating pulse and received pulse and varies in the opposite direction upon coincidence of said gating pulse and received pulse.

3. An automatic signal pulse tracking system for use in a pulse transmitting-receiving system comprising a source of reference pulses, variable duration control pulse generating means having an input trigger terminal and a duration control terminal incorporated therein, said input trigger terminal being coupled to said reference pulse source and responsive to a pulse therefrom to generate a control pulse, gating pulse generating means coupled to said control pulse means and responsive to a pulse therefrom to generate a gating pulse isochronal with the trailing edge of said control pulse, a coincidence circuit coupled to said gating pulse means and to the pulse receiver of said pulse transmitting-receiving system, voltage generating means fed by the output of said coincidence circuit and coupled to said duration control terminal of said variable duration control pulse generating means for generating a voltage the magnitude of which varies in a first given direction upon non-coincidence of said gating pulse and received pulse and varies in the opposite direction upon coincidence of said gating pulse and received pulse.

4. In a pulse transmitting-receiving system the combination of an automatic gain control channel for controlling the gain of the pulse receiver in said system and an automatic signal pulse tracking channel for fixing the position of gating pulses relative to received signal pulses, said pulse tracking channel comprising a source of reference pulses having substantially the same pulse repetition rate as the pulses transmitted by said pulse transmitting system, voltage generating means for generating a voltage the magnitude of which normally slowly varies in a first given sense, control pulse generating means coupled to said voltage generating means and said source of reference pulses responsive to a reference pulse to generate a control pulse having a duration dependent on the magnitude of the voltage generated by said voltage generating means, first gating pulse generating means coupled to said control pulse means responsive to a pulse therefrom to generate a first gating pulse of predetermined duration isochronal with the trailing edge of said control pulse, a coincidence circuit coupled to said gating pulse means and to said pulse receiver, and means coupling said coincidence circuit to said voltage generating means for causing the voltage magnitude thereof to vary in the sense opposite to said first sense upon coincidence of said gating pulse and received pulse, and said gain control channel comprising a second gating pulse generating means coupled to said tracking channel control pulse generating means responsive to a pulse therefrom to generate a second gating pulse wider than said first pulse and of sufficient duration to overlap said received pulse upon coincidence occurring in said tracking channel coincidence circuit, means coupled to said pulse receiver responsive to a gating pulse from said gain control channel gating pulse means to permit the passage therethrough of a coincident received pulse, and averaging means coupled to said last named means for deriving a direct current voltage proportional to the amplitude of said received pulse.

5. In a pulse transmitting-receiving system the combination of an automatic gain control channel for controlling the gain of the pulse receiver in said system and an automatic signal pulse tracking channel for fixing the position of gating pulses relative to received signal pulses, said pulse tracking channel comprising a source of reference pulses having substantially the same pulse repetition rate as the pulses transmitted by said pulse transmitting system, variable duration control pulse generating means coupled to said source of reference pulses responsive to successive reference pulses to generate a control pulse for each of said reference pulses having a leading edge substantially in isochronism with a corresponding reference pulse, first gating pulse generating means coupled to said control pulse means and responsive to the trailing edge of a pulse therefrom to generate a gating pulse means for injecting said received pulses into said tracking channel, and means operative upon coincidence of corresponding gating and received pulses to vary the duration of the control pulses in a first sense and upon non-coincidence to vary said duration in the opposite sense and said gain control channel comprising a second gating pulse generating means coupled to said tracking channel control pulse means responsive to a pulse therefrom to generate a second gating pulse wider than said first pulse and of sufficient duration to overlap the received pulse corresponding to said control pulse, means coupled to said pulse receiver and said second gating pulse means responsive to a gating pulse to permit the passage therethrough of a coincident received pulse, and averaging means coupled to said last named means for deriving a direct current voltage proportional to the amplitude of said received pulse.

ROBERT A. EMMETT, JR.

REFERENCES CITED

The following references are of record in the file of this patent:

UNITED STATES PATENTS

| Number | Name | Date |
|---|---|---|
| 2,408,821 | Stearns | Oct. 8, 1946 |
| 2,516,356 | Tull | July 25, 1950 |